(12) United States Patent
Wu et al.

(10) Patent No.: US 10,361,328 B2
(45) Date of Patent: Jul. 23, 2019

(54) COLOR CHANGING APPARATUSES WITH SOLAR CELLS

(71) Applicant: HEWLETT-PACKARD DEVELOPMENT COMPANY, L.P., Houston, TX (US)

(72) Inventors: Kuan-Ting Wu, Taipei (TW); Wei-Kuang Chu, Taipei (TW); Chienlung Yang, Houston, TX (US); Hui Leng Lim, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/542,906

(22) PCT Filed: Apr. 30, 2015

(86) PCT No.: PCT/US2015/028392
§ 371 (c)(1),
(2) Date: Jul. 11, 2017

(87) PCT Pub. No.: WO2016/175807
PCT Pub. Date: Nov. 3, 2016

(65) Prior Publication Data
US 2018/0047860 A1    Feb. 15, 2018

(51) Int. Cl.
| H01L 31/054 | (2014.01) |
| H01L 31/0232 | (2014.01) |
| H01L 31/053 | (2014.01) |
| G01J 1/50 | (2006.01) |
| G01K 11/12 | (2006.01) |
| G02F 1/01 | (2006.01) |
| H01L 31/042 | (2014.01) |

(Continued)

(52) U.S. Cl.
CPC ............. H01L 31/054 (2014.12); G01J 1/50 (2013.01); G01K 11/12 (2013.01); G02F 1/0126 (2013.01);
(Continued)

(58) Field of Classification Search
CPC ........ G01J 1/50; G01J 1/56; G01J 3/00; G01J 3/12; G01J 3/2823; G01K 11/12;
(Continued)

(56) References Cited

U.S. PATENT DOCUMENTS 5,608,567 A    3/1997  Grupp
6,660,930 B1 *  12/2003  Gonsiorawski ..... B32B 17/1033
                                                      136/244

(Continued)

FOREIGN PATENT DOCUMENTS

CN    1576807    2/2005
WO    WO-0077559    12/2000

OTHER PUBLICATIONS

"Current and Future Technologies for Wearables E-textiles", May 6, 2013; 10 pages.
(Continued)

*Primary Examiner* — Loha Ben
(74) *Attorney, Agent, or Firm* — HPI Patent Department

(57) ABSTRACT

The present disclosure provides a color changing apparatus. The color changing apparatus includes a solar cell assembly to absorb solar energy and converse the solar energy to thermal energy or electromagnetic radiation. The color changing apparatus also includes a color changing element to be in contact with the solar cell and display different color features by absorbing the thermal energy or electromagnetic radiation provided by the solar cell assembly.

13 Claims, 7 Drawing Sheets

(51) Int. Cl.
*E06B 9/24* (2006.01)
*H01L 31/0216* (2014.01)

(52) U.S. Cl.
CPC ...... *G02F 1/0147* (2013.01); *H01L 31/02327* (2013.01); *H01L 31/042* (2013.01); *H01L 31/053* (2014.12); *H01L 31/0547* (2014.12); *E06B 2009/2476* (2013.01); *H01L 31/0216* (2013.01); *Y02E 10/52* (2013.01)

(58) Field of Classification Search
CPC ...... G01K 13/10; G01K 17/00; G02F 1/0126; G02F 1/0147; G02F 1/15; G02F 1/153; G09G 3/34; G09G 3/38; E06B 9/24; E06B 2009/2476; Y02E 10/50; Y02E 10/52; Y02E 10/541; Y02E 10/543; Y02E 10/549; Y02E 10/60; B32B 17/1033; H01L 31/0547; H01L 31/02327; H01L 31/042; H01L 31/053–055; H01L 31/0216; H01L 31/0258; H01L 31/0268; H01L 31/0481; H01L 31/0488; H01L 31/049; H01L 31/0392; H01L 31/0463; H01L 31/0749; H01L 31/06; H01L 31/18; H01L 31/206
USPC ........ 359/241, 244, 265, 274, 275; 345/105, 345/106; 136/200, 213, 225, 243, 244, 136/251, 253, 254, 256, 257; 438/19, 54, 438/57, 67, 70, 73, 74, 80, 81
See application file for complete search history.

(56) References Cited

U.S. PATENT DOCUMENTS

| | | | | |
|---|---|---|---|---|
| 8,188,361 | B2* | 5/2012 | Huang | H01L 31/048 136/244 |
| 8,699,114 | B2* | 4/2014 | McCarthy | G02F 1/0147 359/265 |
| 9,030,724 | B2* | 5/2015 | Agrawal | G02F 1/1506 359/265 |
| 9,256,085 | B2* | 2/2016 | McCarthy | G02F 1/0147 |
| 9,744,559 | B2* | 8/2017 | Harrison | C09D 11/322 |
| 9,905,709 | B2* | 2/2018 | Van Bommel | F21S 9/03 |
| 2005/0175939 | A1 | 8/2005 | Perlo et al. | |
| 2006/0028400 | A1 | 2/2006 | Lapstun et al. | |
| 2008/0094025 | A1 | 4/2008 | Rosenblatt et al. | |
| 2012/0013981 | A1 | 1/2012 | Matera et al. | |
| 2013/0215374 | A1 | 8/2013 | Blum et al. | |
| 2013/0235332 | A1 | 9/2013 | Blum et al. | |
| 2013/0250191 | A1 | 9/2013 | Blum et al. | |
| 2013/0278989 | A1 | 10/2013 | Lam et al. | |
| 2014/0334026 | A1 | 11/2014 | Gross et al. | |
| 2015/0022776 | A1 | 1/2015 | Chen | |

OTHER PUBLICATIONS

Tang, S. Lam Po, et al.; "An Overview of Smart Technologies for Clothing Design and Engineering", 2006; 21 pages.

* cited by examiner

600 forming a color changing element
610

↓ forming a plurality of recesses in the color changing element
620

↓ arranging a solar cell assembly in contact with the color changing element, wherein a plurality of flexible solar cells of the solar cell assembly are arranged into the plurality of recesses, respectively
630

↓ arranging a back-up battery unit in contact with the color changing element
640

FIG. 6

700 forming a plurality of recesses in a substate
710

↓ forming a color changing element over the substrate
720

↓ arranging a solar cell assembly in contact with the color changing element, wherein a plurality of flexible solar cells of the solar cell assembly are arranged into the plurality of recesses, respectively
730

↓ arranging a back-up battery unit in contact with the color changing element
740

FIG. 7

COLOR CHANGING APPARATUSES WITH SOLAR CELLS

BACKGROUND

In recent year, wearable technology is on the rise in personal and business use. Wearable devices, such as smart watches, smart bands, activity trackers, smart glasses, or the like, become more and more popular. Most of the wearable devices have the capability of computing and are able to be connected in wired or wireless way with mobile devices such as smart phone or tablet. Wearable devices can be used to monitor and track fitness-related metrics of human, such as distance walked or run, calorie consumption, and in some cases heartbeat and quality of sleep.

Photochromism is the reversible transformation of a chemical species between two forms by the absorption of electromagnetic radiation, where the two forms have different absorption spectra. Thermochromism is the property of substances to change color due to a change in temperature. Nowadays, photochromic/thermochromic materials have been incorporated into electronic devices for various uses.

BRIEF DESCRIPTION OF THE DRAWINGS

The examples of the present application may be more fully appreciated in connection with the following detailed description taken in conjunction with the accompanying drawings, in which like reference characters refer to like parts throughout, and in which:

FIGS. 5 to 7 illustrate flow charts of various examples of method for producing a color changing apparatus in accordance with the disclosure.

DETAILED DESCRIPTION

Photochromic or thermochromic material can be used in wearable devices to display different color features. Typically, photochromic/thermochromic materials may be energized change color due to electromagnetic radiation or temperature difference caused by power supply such as battery. Conventional battery such as rechargeable battery or non-rechargeable battery has a limited duration for supplying power and needs to be charged or replaced frequently, and thus may be low cost effective. Solar energy may be a renewable, clean, infinite energy resource which may be free and does not cause pollution. Widely using solar energy can reserve some kinds of nonrenewable energy source and reduce environment pollution. Solar energy can be used in remote areas where it may be too expensive to extend the electricity power grid. As compared to other types of battery or cell, solar cell makes nearly no noise at all and require low maintenance to keep running. In view of this, using photochromic or thermochromic materials in combination with solar cells in wearable devices to provide different color features or color information may greatly improve the performance of wearable devices.

In the following detailed description of examples of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Figure 1A:
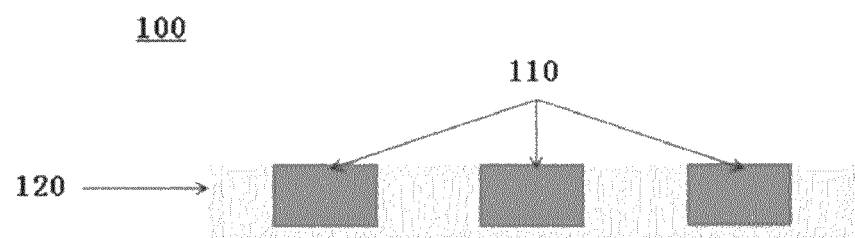
FIGS. 1a to 4b illustrate various examples of a color changing apparatus with a solar cell assembly and a color changing element in accordance with the disclosure.

FIGS. 1a to 4b illustrate various examples of a color changing apparatus which can be used in wearable devices. Referring now to FIG. 1a, a color changing apparatus 100 in accordance with an example of the disclosure is described. The color changing apparatus 100 comprises a solar cell assembly 110 and a color changing element 120. In the example of FIG. 1a, the solar cell assembly 110 can be implemented as a plurality of flexible solar cells, and the color changing element 120 can be implemented as a flexible photochromic band or a flexible thermochromic band, which are made from photochromic material or thermochromic material respectively. The solar cell assembly 110 may be in contact with the color changing element 120. The solar cell assembly 110 can absorb solar energy and provide thermal energy or electromagnetic radiation in the color changing apparatus 100. In the example of being implemented as photochromic band, the color changing element 120 can absorb the electromagnetic radiation provided by the solar cell assembly 110 and change its color accordingly due to the electromagnetic radiation absorbed. Alternatively, in the example of being implemented as thermochromic band, the color changing element 120 can absorb thermal energy provided by the solar cell assembly 110 and change its color accordingly due to the temperature difference caused by the thermal energy absorbed. In the example of FIG. 1a, the flexible solar cells of the solar cell assembly 110 may be arranged into a plurality of recesses formed in the color changing element 120, respectively. The recesses may be separated with each other and each for one flexible solar cell.

Figure 1B:
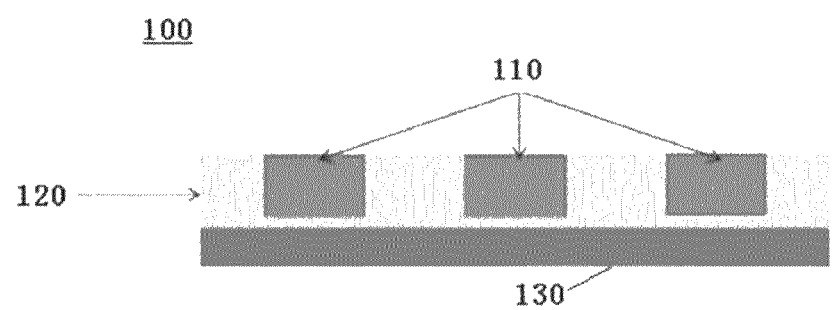

FIG. 1b illustrates another example of a color changing apparatus in accordance with the disclosure. In addition to the solar cell assembly 110 and the color changing element 120 shown in FIG. 1a, the color changing apparatus 100 shown in FIG. 1b further comprises a back-up battery unit 130. The arrangement of the solar cell assembly 110 and the color changing element 120 shown in FIG. 1b may be similar as that of FIG. 1a. The back-up battery unit 130 may also be in contact with color changing element 120. The back-up battery unit 130 may be provided for offering back-up power to cause electromagnetic radiation or temperature difference in the case that the solar cell assembly 110 may be in power shortage and can not be charged effectively, for example, in a weather condition which may be poor for solar cell charging. That is to say, the back-up battery unit 130 can provide thermal energy or electromagnetic radiation in the color changing apparatus 100 in place of the solar cell assembly 110 when the solar cell assembly 110 can not work normally. In an example, the back-up battery unit 130 may be a flexible back-up battery.

Figure 2A:
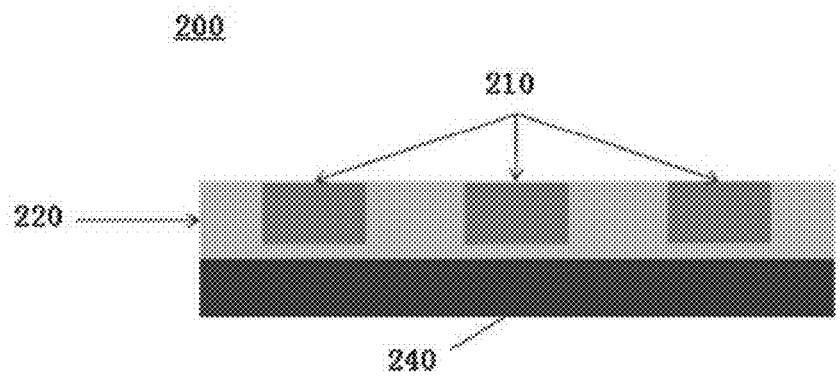

FIG. 2a illustrates another example of a color changing apparatus in accordance with the disclosure. The color changing apparatus 200 shown in FIG. 2a comprises a solar cell assembly 210, a color changing element 220 and a substrate 240. The arrangement of the solar cell assembly 210 and the color changing element 220 shown in FIG. 2a may be similar as the arrangement of the solar cell assembly 110 and the color changing element 120 shown in FIG. 1a. In the example of FIG. 2a, the color changing element 220 may be formed over the substrate 240 and the flexible solar cells comprised by the solar cell assembly 210 may be arranged into a plurality of recesses formed in the color changing element 220, respectively. In an example, the substrate 240 may be a flexible substrate.

Figure 2B:
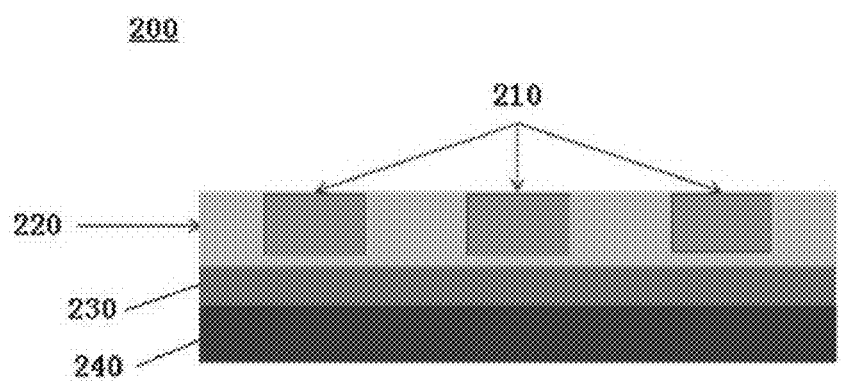

FIG. 2b illustrates another example of a color changing apparatus in accordance with the disclosure. In addition to the solar cell assembly 210, the color changing element 220 and the substrate 240 shown in FIG. 2a, the color changing apparatus 200 shown in FIG. 2b further comprises a back-up battery unit 230. The arrangement of the solar cell assembly 210, the color changing element 220 and the substrate 240 shown in FIG. 2b may be similar as that of FIG. 2a. The back-up battery unit 230 may be similar as the back-up battery unit 130 shown in FIG. 1b, which can be used for providing thermal energy or electromagnetic radiation in the color changing apparatus 200 in place of the solar cell assembly 210 when the solar cell assembly 210 can not work normally. In the example of FIG. 2b, the back-up battery unit 230 may be arranged between the color changing element 220 and the substrate 240. In an example, the back-up battery unit 230 may be a flexible back-up battery.

Figure 3A:
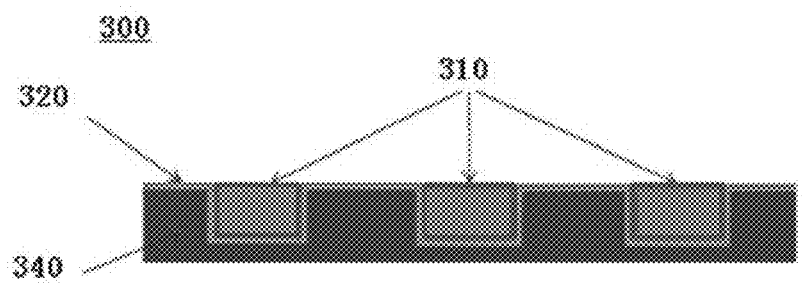

FIG. 3a illustrates another example of a color changing apparatus in accordance with the disclosure. The color changing apparatus 300 shown in FIG. 3a comprises a solar cell assembly 310, a color changing element 320 and a substrate 340. Differently as the examples of FIGS. 1a, 1b, 2a and 2b, in the example of FIG. 3a, the color changing element 320 can be implemented as photochromic coating or thermochromic coating, which are made from photochromic material or thermochromic material respectively, formed over the substrate 340. In the example of FIG. 3a, the solar cell assembly 310 can also be implemented as a plurality of flexible solar cells. The flexible solar cells of the solar cell assembly 310 may be arranged into a plurality of recesses formed in the substrate 340, respectively. The color changing element 320 (e.g. photochromic coating or thermochromic coating) may be formed over the substrate 340 and between the flexible solar cells of the solar cell assembly 310 and the substrate 340. Similarly as the examples of FIGS. 1a, 1b, 2a and 2b, in the example of FIG. 3a, the solar cell assembly 310 may be in contact with the color changing element 320. The solar cell assembly 310 absorbs solar energy and provides thermal energy or electromagnetic radiation in the color changing apparatus 300. In the example of being implemented as photochromic coating, the color changing element 320 absorbs the electromagnetic radiation provided by the solar cell assembly 310 and changes its color accordingly due to the electromagnetic radiation absorbed. Alternatively, in the example of being implemented as thermochromic coating, the color changing element 320 absorbs thermal energy provided by the solar cell assembly 310 and changes its color accordingly due to the temperature difference caused by the thermal energy absorbed. In an example, the substrate 340 may be a flexible substrate.

Figure 3B:
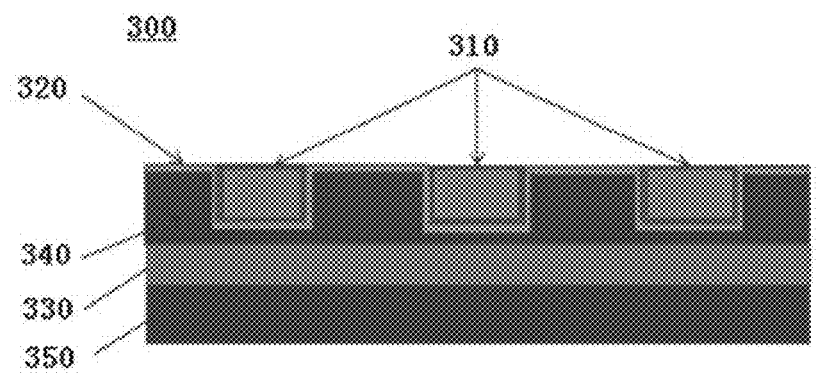

FIG. 3b illustrates another example of a color changing apparatus in accordance with the disclosure. In addition to the solar cell assembly 310, the color changing element 320 and the substrate 340 shown in FIG. 3a, the color changing apparatus 300 shown in FIG. 3b further comprises a back-up battery unit 330 and an additional substrate 350. The arrangement of the solar cell assembly 310, the color changing element 320 and the substrate 340 shown in FIG. 3b may be similar as that of FIG. 3a. The back-up battery unit 330 may be similar as the back-up battery unit 130, 230 shown in FIGS. 1b and 2b, respectively, which can be used for providing thermal energy or electromagnetic radiation in the color changing apparatus 300 in place of the solar cell assembly 310 when the solar cell assembly 310 can not work normally. In the example of FIG. 3b, the back-up battery unit 330 may be arranged between the substrate 340 and the substrate 350. In an example, the back-up battery unit 330 may be a flexible back-up battery, and the substrates 340 and 350 may be flexible substrates.

Figure 4A:
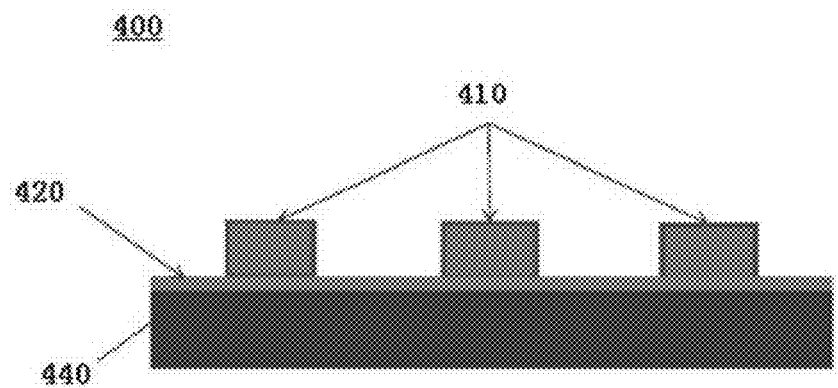

FIG. 4a illustrates another example of a color changing apparatus in accordance with the disclosure. The color changing apparatus 400 shown in FIG. 4a comprises a solar cell assembly 410, a color changing element 420 and a substrate 440. Similarly as the examples of FIGS. 3a and 3b, in the example of FIG. 4a, the solar cell assembly 410 can be implemented as a plurality of flexible solar cells, and the color changing element 420 can be implemented as photochromic coating or thermochromic coating formed over the substrate 440. Differently as the examples of FIGS. 3a and 3b, in the example of FIG. 4a, there may be no recess formed in the substrate 440, and the flexible solar cells of the solar cell assembly 410 may be arranged over the top side of the substrate 440 with the color changing element 420 being formed between the solar cell assembly 410 and the substrate 440. That is to say, the color changing element 420 (e.g. photochromic coating or thermochromic coating) may be formed over the substrate 440 and between the flexible solar cells the solar cell assembly 410 and the substrate 440.

Figure 4B:
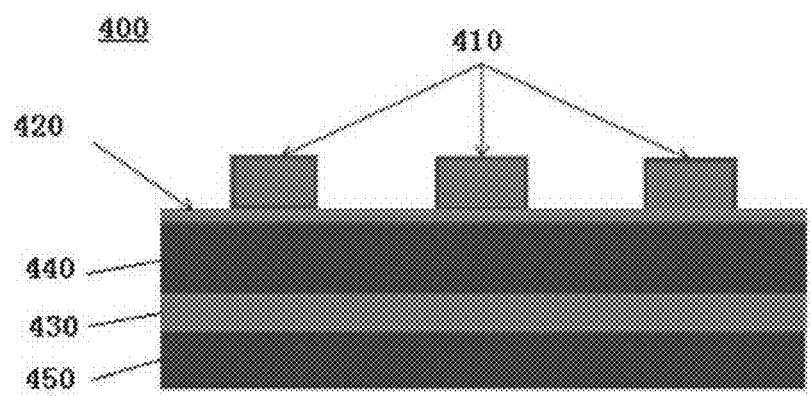

FIG. 4b illustrates another example of a color changing apparatus in accordance with the disclosure. In addition to the solar cell assembly 410, the color changing element 420 and the substrate 440 shown in FIG. 4a, the color changing apparatus 400 shown in FIG. 4b further comprises a back-up battery unit 430 and an additional substrate 450. The arrangement of the solar cell assembly 410, the color changing element 420 and the substrate 440 shown in FIG. 4b may be similar as that of FIG. 4a. The back-up battery unit 430 may be similar as the back-up battery unit 130, 230 and 330 shown in FIGS. 1b, 2b and 3b, respectively, which can be used for providing thermal energy or electromagnetic radiation in the color changing apparatus 400 in place of the solar cell assembly 410 when the solar cell assembly 410 can not work normally. Similarly as the example of FIG. 3b, in the example of FIG. 4b, the back-up battery unit 430 may be arranged between the substrate 440 and the substrate 450. In an example, the back-up battery unit 430 may be a flexible back-up battery, and the substrates 440 and 450 may be flexible substrates.

Figure 5:
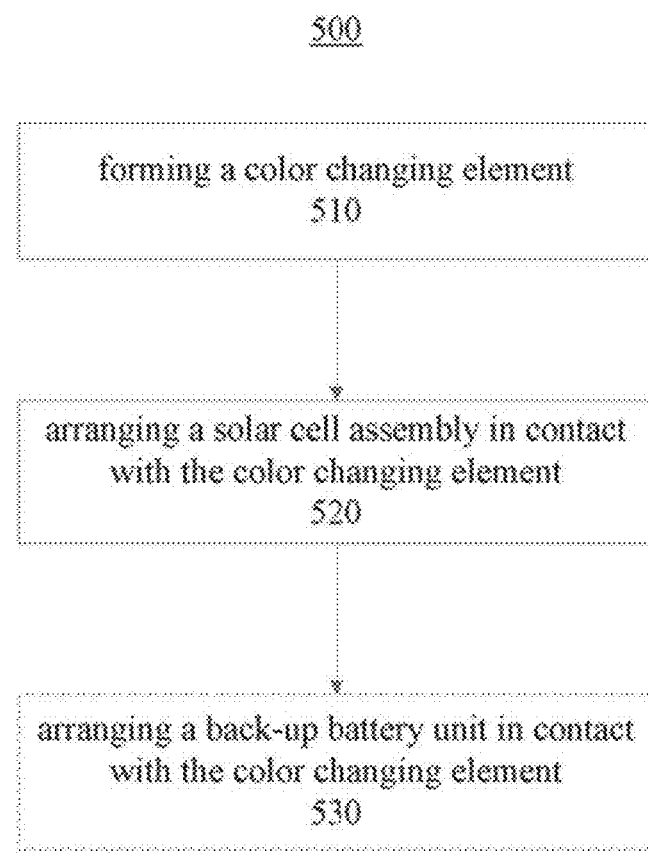

FIG. 5 illustrates a flow chart of an example of method for producing a color changing apparatus in accordance with the disclosure. Method 500 comprises step 510 and step 520. At step 510, a color changing element may be formed. At step 520, a solar cell assembly may be arranged in contact with the color changing element. In an example, the solar cell assembly is implemented as a plurality of flexible solar cells, and the color changing element is implemented as a flexible photochromic band or a flexible thermochromic band. The solar cell assembly can absorb solar energy and provide thermal energy or electromagnetic radiation. In the example of being implemented as photochromic band, the color changing element can absorb the electromagnetic radiation provided by the solar cell assembly and change its color accordingly due to the electromagnetic radiation absorbed. Alternatively, in the example of being implemented as thermochromic band, the color changing element absorbs thermal energy provided by the solar cell assembly and change its color accordingly due to the temperature difference caused by the thermal energy absorbed.

In an example, the method 500 further comprises an optional step 530 (which is shown in dash line) of arranging a back-up battery unit in contact with the color changing element. The back-up battery unit can provide thermal energy or electromagnetic radiation in the color changing apparatus in place of the solar cell assembly when the solar cell assembly can not work normally. In an example, the back-up battery unit may be a flexible back-up battery. In an example, the color changing element may be formed over a substrate. In another example, another substrate may be provided, and the back-up battery unit may be arranged between those two substrates.

FIG. 6 illustrates a flow chart of another example of method for producing a color changing apparatus accordance with the disclosure. Method 600 comprises step 610, step 620 and step 630. At step 610, a color changing element may be formed. At step 620, a plurality of recesses may be formed in the color changing element. At step 630, a solar cell assembly may be arranged in contact with the color changing element, wherein a plurality of flexible solar cells of the solar cell assembly may be arranged into the plurality of recesses, respectively. The recesses may be separated with each other and each for one flexible solar cell.

In an example, the method 600 further comprises an optional step 640 (which may be similar as the step 530 of method 500 shown in FIG. 5, and is also shown in dash line) of arranging a back-up battery unit in contact with the color changing element. The color changing element, the solar cell assembly and the back-up battery in method 600 may be similar as those in method 500. In an example, the color changing element may be formed over a substrate. In an example, the substrate may be a flexible substrate. In another example, another substrate may be provided, and the back-up battery unit may be arranged between those two substrates.

FIG. 7 illustrates a flow chart of another example of method for producing a color changing apparatus in accordance with the disclosure. Method 700 comprises step 710, step 720 and step 730. At step 710, a plurality of recesses may be formed in a substrate. At step 720, a color changing element may be formed over the substrate. In an example, the substrate may be a flexible substrate. At step 730, a solar cell assembly may be arranged in contact with the color changing element, wherein a plurality of flexible solar cells of the solar cell assembly may be arranged into the plurality of recesses, respectively. The recesses may be separated with each other and each for one flexible solar cell.

In an example, the color changing element can be implemented as photochromic coating or thermochromic coating formed over a substrate. The color changing element (e.g. photochromic coating or thermochromic coating) may be formed between the flexible solar cells of the solar cell assembly and the substrate.

In an example, the method 700 further comprises an optional step 740 (which may be also similar as the step 530 of method 500 shown in FIG. 5, and is also shown in dash line) of arranging a back-up battery unit in contact with the color changing element. The color changing element, the solar cell assembly and the back-up battery in method 700 may be also similar as those method 500. In another example, another substrate may be provided, and the backup battery unit may be arranged between those two substrates.

In another example, there may be no recess to be formed in the color changing element or the substrate, and the flexible solar cells of the solar cell assembly may be arranged over the top side of the color changing element, or over the top side of the substrate with the color changing element being formed between the solar cell assembly and the substrate.

In the examples of the disclosure, the flexible solar cells include but not limited to solar cells including single crystal silicon, polycrystal silicon, amorphous silicon, GaAs, InP, CdTe, CuInxGa(1−x)Se2, Cadmium Telluride (CdTe), Copper Indium Selenide (CIS), Copper Indium Gallium Selenide (CIGS), Gallium arsenide (GaAs), and/or CuInSe2; Biohybrid solar cell; Buried contact solar cell; Concentrated PV cell (CVP and HCVP); Copper indium gallium selenide solar cells (CIGS); Crystalline silicon (c-Si) solar cell; Dye-sensitized solar cell (DSSC); Gallium arsenide germanium solar cell; Hybrid solar cell; Luminescent solar concentrator cell (LSC); Micromorph (tandem-cell using a-Si/μc-Si); Monocrystalline solar cell (mono-Si); Multijunction solar cell (MJ); Nanocrystal solar cell; Organic solar cell (OPV); Perovskite solar cell; Photoelectrochemical cell (PEC); Plasmonic solar cell; Plastic solar cell; Polycrystalline solar cell (multi-Si); Polymer solar cell; Quantum dot solar cell; Solid-state solar cell; Thin film solar cell (TFSC); Wafer solar cell, or the like.

In the examples of the disclosure, the photochromic band or coating includes but not limped to Spiropyrans, Spirooxazines and/or Naphthopyrans (also known as chromenes) or the like.

In the examples of the disclosure, thermochromic band or coating include but not limited to N-acyl leuco-methylene blue derivatives (BO), fluoran dyes, fulgides, spirolactones, crystal violet lactone analogues (diarylphthalide compounds), diphenylmethane compounds, spiropyran compounds, 1,2,3-benzotriazole, dibenzotriazole, thioureas, saccharin and derivatives, halohydrins boric acid and derivatives, guanidine derivatives (Ex. phenyl diguanide), 4-hydroxy coumarin derivatives, cholesteric liquid crystal and/or chiral nematic liquid crystal, or the like.

In the examples of the disclosure, the flexible substrates include but not limited to Polyethylene terephthalate (PET), polyethylene naphthalate (PEN), polyimide (PI), synthetic paper, polycarbonate, polyacrylics (PMMA), polyurethane, rubber, polyolefin and/or elastic polymers, or the like.

In the examples of the disclosure, the wearable devices comprising the color changing apparatus in accordance with the disclosure include but not limited to smart watches, smart bands, activity trackers, smart glasses, or the like.

While the disclosure has been described with respect to a limited number of examples, those skilled in the art, having benefit of this disclosure, will appreciate that other example embodiments can be devised which do not depart from the scope of the disclosure as disclosed herein. Accordingly, the scope of the disclosure should be limited only by the attached claims.

The invention claimed is:

1. A color changing apparatus, comprising:
   a color changing element, wherein the color changing element is a flexible photochromic band; and
   a solar cell assembly to absorb solar energy and provide thermal energy or electromagnetic radiation, the solar cell assembly comprising a plurality of flexible solar cells arranged into a plurality of recesses of the color changing element, wherein the color changing element contacts the solar cell assembly and displays different color features by absorbing the thermal energy or electromagnetic radiation provided by the solar cell assembly.

2. The apparatus according to claim 1, further comprising a back-up battery unit to provide thermal energy or electromagnetic radiation in the color changing apparatus in place of the solar cell assembly when the solar cell assembly does not work normally.

3. The apparatus according to claim 1, wherein the color changing element is disposed over a substrate.

4. The apparatus according to claim 3, wherein the flexible photochromic band includes a flexible photochromic coating, and wherein the plurality of flexible solar cells of the solar cell assembly are arranged into a plurality of recesses formed in the substrate, respectively, and the color changing element is formed between the plurality of flexible solar cells of the solar cell assembly and the substrate.

5. The apparatus according to claim 3, wherein the solar cell assembly is arranged on the top side of the substrate with the color changing element being formed between the solar cell assembly and the substrate.

6. A method for producing a color changing apparatus, comprising:

forming a color changing element to display different color features by absorbing thermal energy or electromagnetic radiation provided by a solar cell assembly, wherein the color changing element is a flexible thermochromic band;

forming a plurality of recesses into the color changing element; and arranging the solar cell assembly comprising a plurality of flexible solar cells arranged into the plurality of recesses, wherein the solar cell assembly is to absorb solar energy and provide the thermal energy or the electromagnetic radiation.

7. The method according to claim 6, further comprising arranging a back-up battery unit in contact with the color changing element, the back-up battery unit is to provide thermal energy or electromagnetic radiation in the color changing apparatus in place of the solar cell assembly when the solar cell assembly does not work normally.

8. The method according to claim 6, wherein forming a color changing element comprises forming the color changing element over a substrate.

9. The method according to claim 8, wherein the flexible thermochromic band includes a flexible thermochromic coating, and wherein arranging the solar cell assembly with the color changing element comprises forming a plurality of recesses in the substrate and arranging the plurality of flexible solar cells of the solar cell assembly into the plurality of recesses in the substrate, respectively, and wherein the color changing element is formed between the plurality of flexible solar cells of the solar cell assembly and the substrate.

10. The method according to claim 8, wherein arranging the solar cell assembly with the color changing element comprises arranging the solar cell assembly on the top side of the substrate with the color changing element being formed between the solar cell assembly and the substrate.

11. A wearable device comprising:

a color changing apparatus, the color changing apparatus comprising:

a color changing element, wherein the color changing element is a flexible photochromic band or a flexible thermochromic band; and a solar cell assembly to absorb solar energy and provide thermal energy or electromagnetic radiation, the solar cell assembly comprising a plurality of flexible solar cells arranged into a plurality of recesses of the color changing element, wherein the color changing element contacts the solar cell assembly and displays different color features by absorbing the thermal energy or electromagnetic radiation provided by the solar cell assembly.

12. The wearable device according to claim 11, wherein the color changing apparatus further comprising a back-up battery unit to provide thermal energy or electromagnetic radiation in the color changing apparatus in place of the solar cell assembly when the solar cell assembly does not work normally.

13. The wearable device according to claim 11, wherein the color changing element includes a photochromic coating or a thermochromic coating.

\* \* \* \* \*